United States Patent
Vander Mey et al.

(10) Patent No.: US 9,692,352 B2
(45) Date of Patent: Jun. 27, 2017

(54) SOLAR COLLECTOR AND CONVERSION ARRAY

(71) Applicant: BrightLeaf Technologies, Inc., Montrose, CO (US)

(72) Inventors: James E. Vander Mey, Dunnellon, FL (US); Douglas Helff Kiesewetter, Montrose, CO (US); Shane Mark Duckworth, Montrose, CO (US)

(73) Assignee: BRIGHTLEAF TECHNOLOGIES, INC., Montrose, CO (US)

( * ) Notice: Subject to any disclaimer, the term of this patent is extended or adjusted under 35 U.S.C. 154(b) by 107 days.

(21) Appl. No.: 14/792,113

(22) Filed: Jul. 6, 2015

(65) Prior Publication Data
US 2015/0311858 A1    Oct. 29, 2015

Related U.S. Application Data

(62) Division of application No. 12/899,316, filed on Oct. 6, 2010, now Pat. No. 9,074,795.

(51) Int. Cl.
*H01L 31/052* (2014.01)
*H02S 20/32* (2014.01)
(Continued)

(52) U.S. Cl.
CPC .............. *H02S 20/32* (2014.12); *F24J 2/10* (2013.01); *F24J 2/523* (2013.01); *F24J 2/542* (2013.01);
(Continued)

(58) Field of Classification Search
CPC ..................................... H01L 31/052–31/0528
See application file for complete search history.

(56) References Cited

U.S. PATENT DOCUMENTS 4,134,387 A * 1/1979 Tornstrom ............. F24J 2/1052
126/684
4,169,738 A * 10/1979 Luque ..................... H01L 31/06
136/246
(Continued)

FOREIGN PATENT DOCUMENTS

JP        08-330619 A    12/1996
WO   WO2006/120475 A1   11/2006
(Continued)

OTHER PUBLICATIONS

Wu, "Supernormal Vision, A Force on Adaptive Optics Improves Images of the Eye and Boosts Vision", found at www.sciencenews.org/sn_arc97/11_15_97/bab1.htm.
(Continued)

*Primary Examiner* — Golam Mowla
(74) *Attorney, Agent, or Firm* — Bracewell LLP; Keith R. Derrington (57) ABSTRACT

A solar array for collecting sunlight that is converted into electricity. The array includes an arrangement of solar collectors strategically positioned on a frame to maximize the amount of sunlight collected in relation to the size of the array. The collectors are plate like members with a reflective side and shaped so that sunlight collected by the reflective side is concentrated at a location away from the reflective side. The collectors are recumbently positioned in rows with their respective reflective sides directed away from the array frame. The collectors are spaced apart so that no collector casts shade on any part of another collector and substantially no sunlight between adjacent collectors.

5 Claims, 7 Drawing Sheets

(51) Int. Cl.
  *F24J 2/10*    (2006.01)
  *F24J 2/52*    (2006.01)
  *F24J 2/54*    (2006.01)
  *H02S 20/00*   (2014.01)
  *H01L 31/054*  (2014.01)
  *H02S 40/22*   (2014.01)
  *F24J 2/00*    (2014.01)

(52) U.S. Cl.
  CPC .......... *H01L 31/0547* (2014.12); *H02S 20/00* (2013.01); *H02S 40/22* (2014.12); *F24J 2002/0084* (2013.01); *F24J 2002/108* (2013.01); *F24J 2002/1014* (2013.01); *Y02E 10/47* (2013.01); *Y02E 10/52* (2013.01)

(56) References Cited

U.S. PATENT DOCUMENTS

| | | | | |
|---|---|---|---|---|
| 4,175,391 | A * | 11/1979 | Baer | F03G 3/00 126/579 |
| 4,296,731 | A * | 10/1981 | Cluff | F24J 2/16 126/578 |
| 4,370,974 | A * | 2/1983 | Maxey | F24J 2/045 126/621 |
| 4,711,972 | A * | 12/1987 | O'Neill | F24J 2/085 136/246 |
| 5,022,929 | A * | 6/1991 | Gallois-Montbrun | F24J 2/405 136/245 |
| 7,473,000 | B2 | 1/2009 | Spencer et al. | |
| 7,545,011 | B2 | 6/2009 | Horne et al. | |
| 2007/0256724 | A1 | 11/2007 | Fork et al. | |
| 2007/0256725 | A1 | 11/2007 | Fork et al. | |
| 2007/0256726 | A1 | 11/2007 | Fork et al. | |
| 2008/0037141 | A1 | 2/2008 | Tom et al. | |
| 2008/0129984 | A1 | 6/2008 | Cowley | |
| 2008/0142000 | A1 | 6/2008 | Milbourne | |
| 2008/0142076 | A1 | 6/2008 | Horne et al. | |
| 2008/0142077 | A1 | 6/2008 | Spencer et al. | |
| 2008/0185032 | A1 | 8/2008 | MacDonald | |
| 2008/0185039 | A1 | 8/2008 | Chan | |
| 2008/0185040 | A1 | 8/2008 | Tom et al. | |
| 2008/0186593 | A1 | 8/2008 | Chan et al. | |
| 2008/0203411 | A1 | 8/2008 | Chan | |
| 2008/0251113 | A1 | 10/2008 | Horne et al. | |
| 2008/0258051 | A1 | 10/2008 | Heredia et al. | |
| 2008/0264468 | A1 | 10/2008 | Young et al. | |
| 2008/0264469 | A1 | 10/2008 | Milbourne et al. | |
| 2008/0289271 | A1 | 11/2008 | Miller et al. | |
| 2009/0025784 | A1 | 1/2009 | Chan et al. | |
| 2009/0025789 | A1 | 1/2009 | Chan et al. | |
| 2009/0026279 | A1 | 1/2009 | Dittmer et al. | |
| 2009/0050191 | A1 | 2/2009 | Young et al. | |
| 2009/0056790 | A1 | 3/2009 | Tian et al. | |
| 2009/0101207 | A1 | 4/2009 | Milbourne et al. | |
| 2009/0107540 | A1 | 4/2009 | Milbourne | |
| 2009/0114211 | A1 | 5/2009 | Homyk et al. | |
| 2009/0114213 | A1 | 5/2009 | McDonald et al. | |
| 2009/0114265 | A1 | 5/2009 | Milbourne et al. | |
| 2009/0114280 | A1 | 5/2009 | Jensen et al. | |
| 2009/0116013 | A1 | 5/2009 | Tom et al. | |
| 2009/0117332 | A1 | 5/2009 | Ellsworth et al. | |
| 2009/0120499 | A1 | 5/2009 | Prather et al. | |
| 2009/0120500 | A1 | 5/2009 | Prather et al. | |
| 2009/0126774 | A1 | 5/2009 | Taylor, II et al. | |
| 2009/0179139 | A1 | 7/2009 | Hines et al. | |
| 2009/0235985 | A1 | 9/2009 | Lubart et al. | |

FOREIGN PATENT DOCUMENTS

| | | |
|---|---|---|
| WO | WO2006/138619 A2 | 12/2006 |
| WO | WO2009/030037 A1 | 3/2009 |

OTHER PUBLICATIONS

This application is related to U.S. Appl. No. 12/899,316, filed Oct. 6, 2010.

This application is related to U.S. Appl. No. 12/899,337, filed Oct. 6, 2010.

* cited by examiner

SOLAR COLLECTOR AND CONVERSION ARRAY

This application is a divisional of, and claims priority to and the benefit of, co-pending U.S. patent application Ser. No. 12/899,316, filed Oct. 6, 2010, which claimed priority from U.S. Provisional Application Ser. No. 61/249,226, filed Oct. 6, 2009, the full disclosures of which are hereby incorporated by reference herein for all purposes.

BACKGROUND OF THE INVENTION

1. Field of the Invention

The present disclosure relates in general to a solar conversion system that collects and concentrates solar energy, then converts the collected/concentrated energy into electricity. More specifically, the present disclosure includes a solar conversion system having an array of solar collectors open to ambient conditions, and arranged to maximize the solar energy collected for the given area of the array.

2. Description of Prior Art

Solar collection systems that concentrate solar energy generally employ a number of collectors; each having a reflective side configured to focus the reflected light onto a solar conversion cell. Because the solar energy is concentrated, the reflective surface area exceeds the conversion cell area by a significant amount. Solar collection and conversion systems often consolidate the collectors into a solar array, thereby boosting the electricity generating capacity of the conversion system. The collectors within an array are typically positioned within a localized area to minimize the total area of the array. Reducing array size can also reduce the other components and material that make up an array, such as wiring, frame structures, and the like.

Figures 1, 1A, 2:
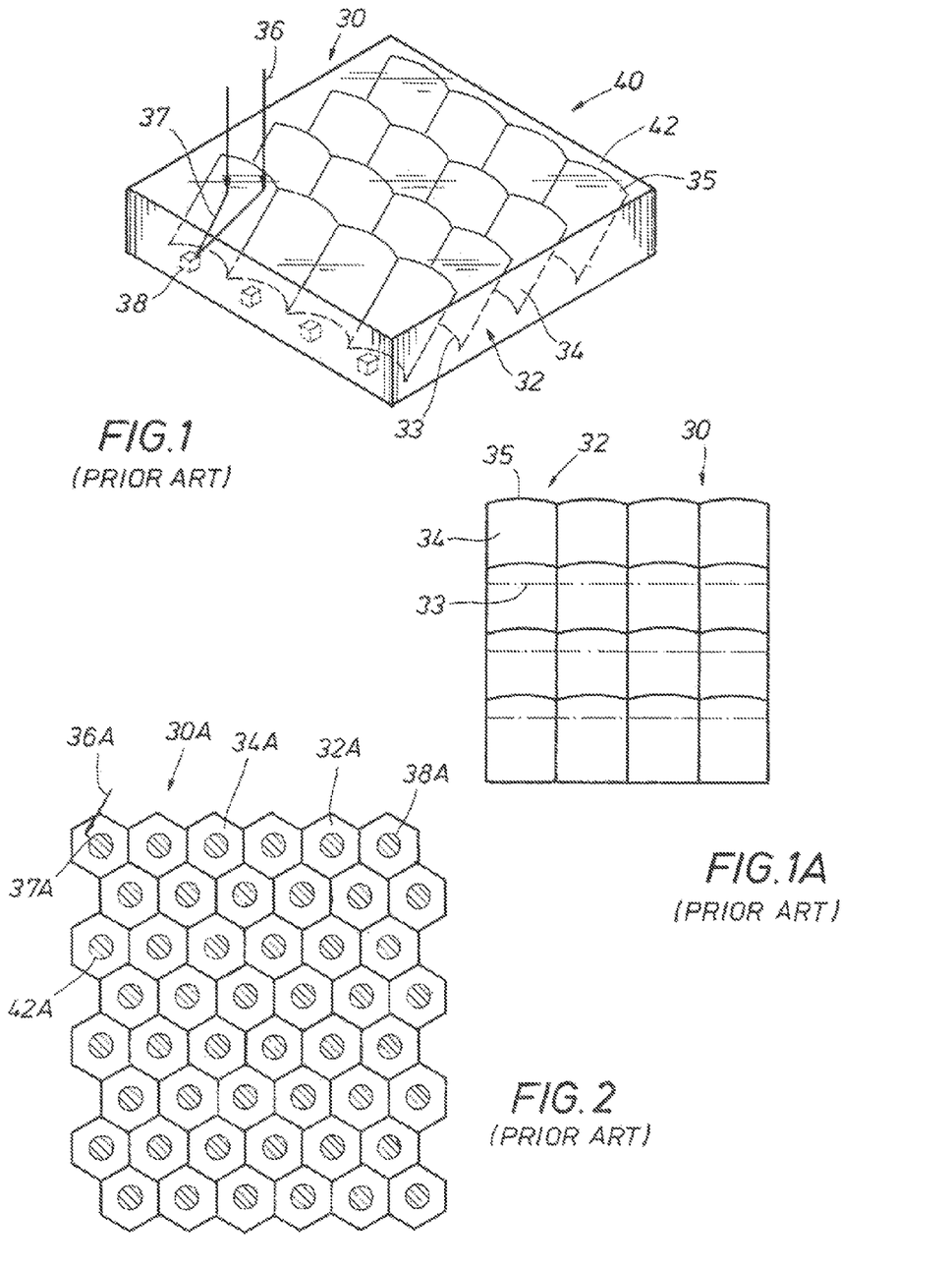
FIG. 1 is a side perspective view of a prior art solar array.
FIG. 1A is an overhead view of a portion of the solar array of FIG. 1.
FIG. 2 is an overhead view of a prior art solar array.

An example of a prior art array 30 is shown in a side perspective view in FIG. 1 having a number of parabolic-shaped collectors 32. Each collector 32 is shown having a concave and convex side and all with their concave sides facing forward. A reflective surface 34 is provided on the concave side of each collectors 32. The collectors 32 are mounted on their bottom edge 33 with their upper end 35 inclined rearward to direct their concave sides at an angle between horizontal and vertical. Solar energy is shown represented as sun rays 36 that contact the reflective surface 34 and are reflected away as reflected rays 37 towards a receiver 38. The concave configuration of the reflective surface 34 converges the reflected rays 37 so they are concentrated when reaching the receiver 38. A solar conversion cell (not shown) is positioned on the receiver 38 to receive the concentrated reflected rays 37 and convert the rays 37 to electricity. The array 30 is shown within a housing 40 provided with a cover 42 spanning the space above the array 30. Although the cover 42 is transparent, some of the rays 36 from the sun are reflected and do not reach the reflective surfaces 34 of the collectors 32.

An overhead plan view of a portion of the array 30 is shown in FIG. 1A representing the perspective of the sun rays 36 when reaching the array 30. The spacing between forward and rearward collectors 32, combined with the incline of each collector 32, causes the upper end 35 to cast a shadow on the rearward collect 32 along its bottom edge 33. The shaded bottom edge 33 of each collector 32 is illustrated with a dashed line.

Another prior art example of a solar array 30A is illustrated in an overhead view in FIG. 2. In this example, an arrangement of collectors 32A are assembled where each individual collector 32A outer periphery is multi-sided and hexagonal. The collectors 32A are bowl-like parabolic members having an upward facing concave side. A reflective surface 34A is provided on the concave side. A transparent cover 42A spans between the outer periphery of each collector 32A that provides a mounting surface for a receiver 38A. The receiver 38A is shown disposed above the midsection of the collector 32A offset from its reflective surface 34A. When the solar array 30A is set in the path of sunlight, sun rays 36A contact the reflected surfaces 34A and reflect as reflected rays 37A. The reflective surfaces 34 A are shaped to direct and concentrate the reflected rays 37A at their respective receivers 38A. The presence of the receivers 38A above the collectors 32A shades at least a portion of the reflective surface 34A.

SUMMARY OF THE INVENTION

Disclosed herein is a solar array for collecting sunlight that is converted into electricity. The array includes an arrangement of solar collectors strategically positioned on a frame to maximize the amount of sunlight collected in relation to the size of the array. The collectors are plate like members with a reflective side and shaped so that sunlight collected by the reflective side is concentrated at a location away from the reflective side. The collectors are recumbently positioned in rows with their respective reflective sides directed away from the array frame. The collectors are spaced apart so that no collector casts shade on any part of another collector and substantially no sunlight between adjacent collectors.

BRIEF DESCRIPTION OF THE DRAWINGS

Some of the features and benefits of the present invention having been stated, others will become apparent as the description proceeds when taken in conjunction with the accompanying drawings, in which.

It will be understood the improvement described herein is not limited to the embodiments provided. On the contrary, the present disclosure is intended to cover all alternatives, modifications, and equivalents, as may be included within the spirit and scope of the improvement as defined by the appended claims.

DETAILED DESCRIPTION OF THE INVENTION

The present invention will now be described more fully hereinafter with reference to the accompanying drawings in which embodiments of the invention are shown. This invention may, however, be embodied in many different forms and should not be construed as limited to the illustrated embodiments set forth herein; rather, these embodiments are provided so that this disclosure will be thorough and complete, and will fully convey the scope of the invention to those skilled in the art. Like numbers refer to like elements throughout. For the convenience in referring to the accompanying figures, directional terms are used for reference and illustration only. For example, the directional terms such as "upper", "lower," "above", "below", and the like are being used to illustrate a relational location.

It is to be understood that the invention is not limited to the exact details of construction, operation, exact materials, or embodiments shown and described, as modifications and equivalents will be apparent to one skilled in the art. In the drawings and specification, there have been disclosed illustrative embodiments of the invention and, although specific terms are employed, they are used in a generic and descriptive sense only and not for the purpose of limitation.

Figure 3:
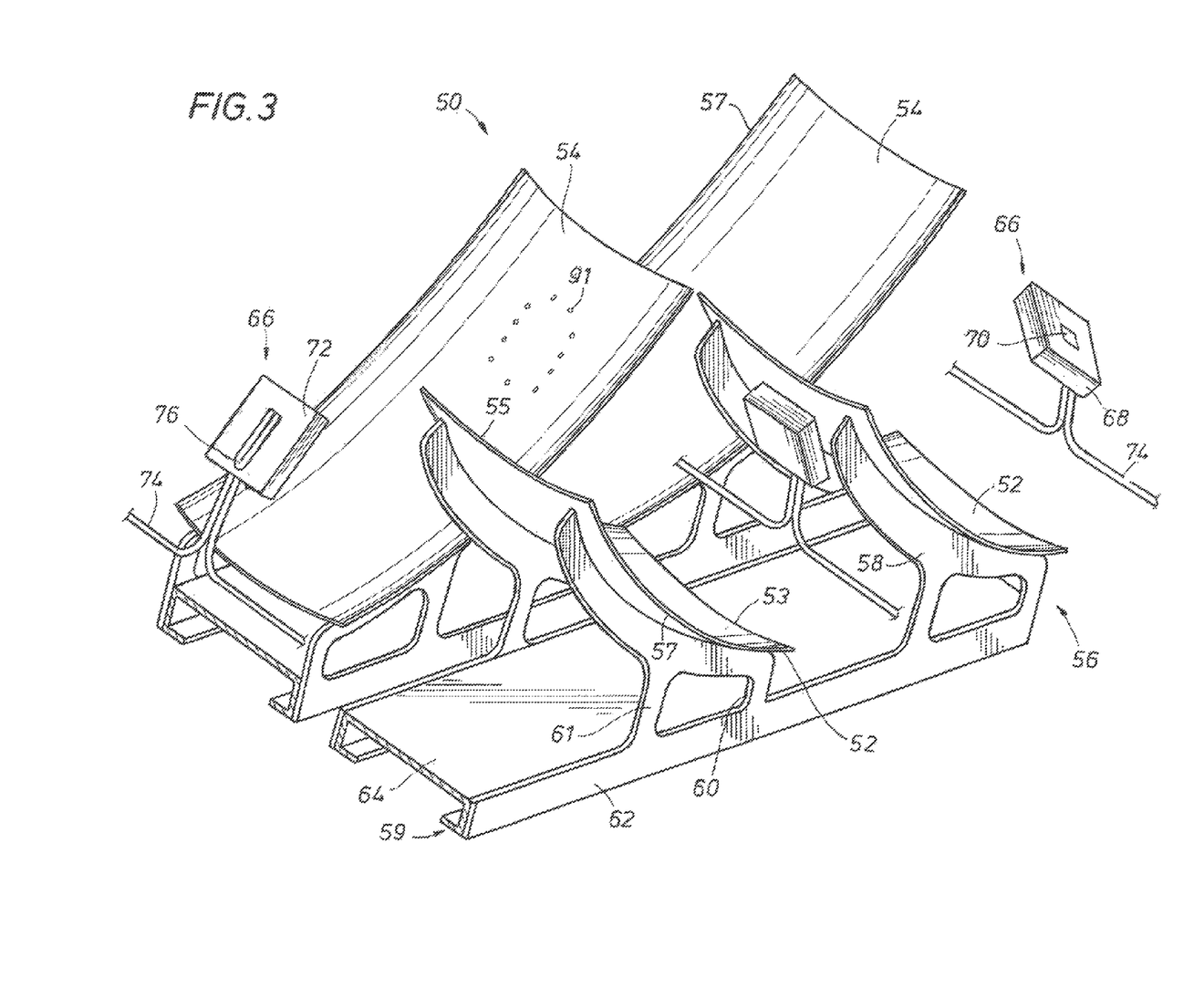
FIG. 3 is a side perspective view of example solar collectors and receivers within a solar array in accordance with the present disclosure.

Disclosed herein is a solar conversion system having an array of solar collectors that are arranged to capture a maximum amount of solar energy for a given surface area of the array. The collectors may be strategically arranged within the array so that no collector is positioned to shade any portion of another collector. Moreover, the collectors can be shaped so that when arranged into the array, only an insignificant amount of light passes between any two adjacent collectors. FIG. 3 illustrates in a side perspective view a portion of an example of a solar array 50. The array 50 shown includes plate-like collectors 52, 54; each with a convex and concave side and having an upper edge 55 parallel to its lower edge 53 and with parallel lateral edges 57. The collectors 52, 54 are mounted on a frame 56 and supported on their convex side. In the portion of the array 50 illustrated, collectors 52 are arranged in a row 78 (see FIG. 7) with their concave sides facing the same direction. Collectors 54, which are substantially the same as collectors 52, are arranged in an adjacent row 79 (see FIG. 7) with their respective concave sides facing the same direction, which is opposite the direction of the collectors 52.

The frame 56 includes girders 62 shown supporting the collectors 52, 54 and each disposed along a line extending adjacent the lateral edge 57 of each collector 52, 54. The girders 62 illustrated in FIG. 3 are generally parallel to one another. The collectors 52, 54 rest on curved cradles 58 contoured to match the concave side of each of the collectors 52, 54. Each cradle 58 is supported by a leg 60 attached on the lower forward end of each cradle 58 and another leg 61 attached about the midpoint of each cradle 58. The legs 61 are longer than legs 60, which inclines the cradles 58 thereby recumbently positioning the collectors 52, 54. The legs 60, 61 are anchored on their respective lower ends on the elongated girders 62 that longitudinally extend adjacent the lateral edges 57 of each of the collectors 52, 54. Elongated channel members 64 are provided in the space between the girders 62; the channel members 64 are positioned so their open portion is facing downward and away from the collectors 52, 54.

As will be discussed in more detail below, the concave sides of each of the collectors 52, 54 have a reflective surface. Further illustrated in FIG. 3 are solar modules 66 that are associated with each collector 52, 54. The modules 66 include a solar cell 70 and are disposed at a location so that concentrated light reflected from the reflective surface of the collectors 52, 54 coincides with the surface of the solar cell 70. The module 66 includes an outer housing 68 for protecting the cell 70 and its associated hardware (not shown). Heat pipes 74 depend from the housing 68 for transferring heat from the solar cell 70. The module 66 includes a planar base 72 on its side opposite the corresponding collector 52, 54. The base 72 can be a metallic member for absorbing thermal energy from the solar cell 70 and may also include mounting means thereon.

Figure 4:
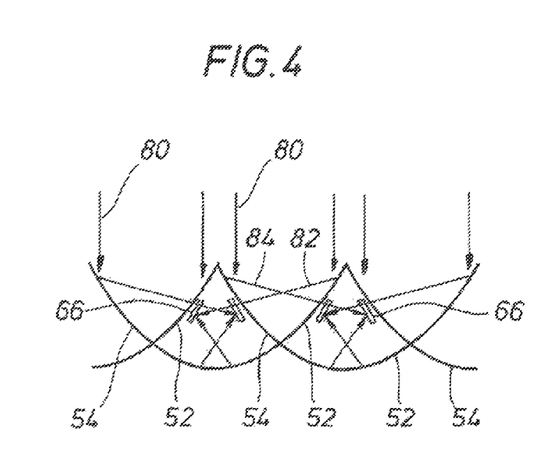
FIG. 4 is a schematic illustration of sun rays received and reflected by the collectors of FIG. 3.

FIG. 4 schematically depicts the collectors 52, 54 collecting sun rays and reflecting the rays to a concentrated area that coincides with the surface of an associated solar cell. As noted above, the collectors 52, 54 each have a reflective surface on their concave sides that reflects sun rays 80 towards the associated solar module 66. The rays 82 reflecting from collectors 52 in row 78 have at one point, matching elevation and lengthwise coordinates as rays 82 reflecting from oppositely facing collectors 54 in row 79. These matching rays 84 appear to intersect at this point. However, since the collectors 52, 54 are in different rows 78, 79 set a lateral distance apart, there would be no intersection of these reflected rays 82.

Figure 5:
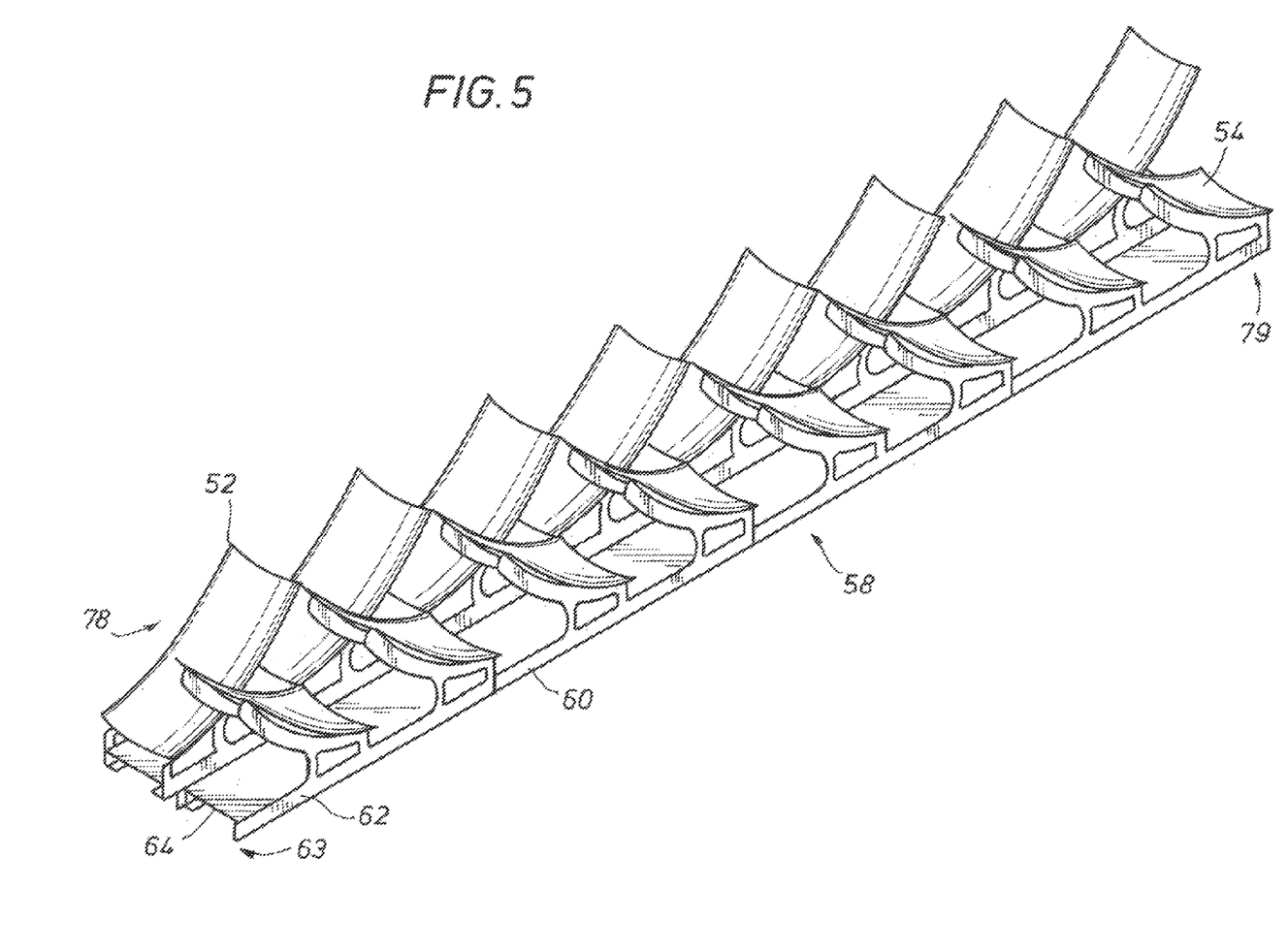
FIG. 5 is an illustration in a perspective view of solar collectors arranged in rows.
Figure 7:
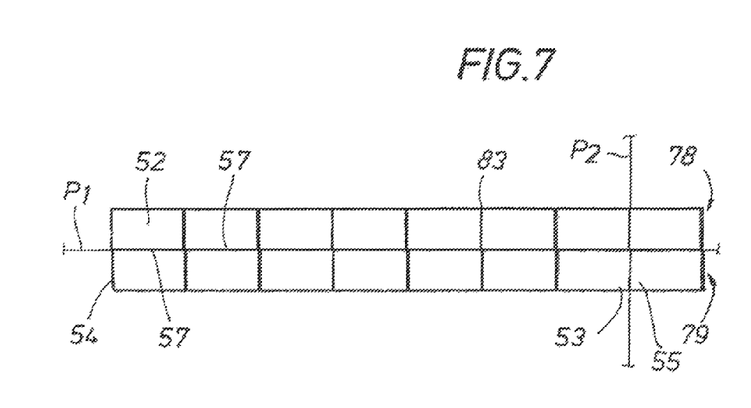
FIG. 7 is an overhead plan view of the solar collectors of FIG. 5.

Illustrated in a side perspective view in FIG. 5 are rows 78, 79 of collectors 52, 54 that make up part of an example of an array 50. As illustrated in FIG. 3, the lateral edges 57 of each of the collectors 52, 54 are substantially parallel. Thus in an embodiment of a solar array 50, the collectors 52, 54 may be disposed in adjacent rows so that the lateral edges 57 adjoin along a vertically oriented plane $P_1$. FIG. 7 provides an overhead view of the rows 78, 79 of FIG. 5 illustrating the plane $P_1$ extending along the lateral sides of each collector 52, 54 in the direction of the rows 78, 79. Aligning the lateral sides 57 of each row 78, 79 along the plane $P_1$ precludes sunlight from passing between the adjacent rows 78, 79.

Figure 6:
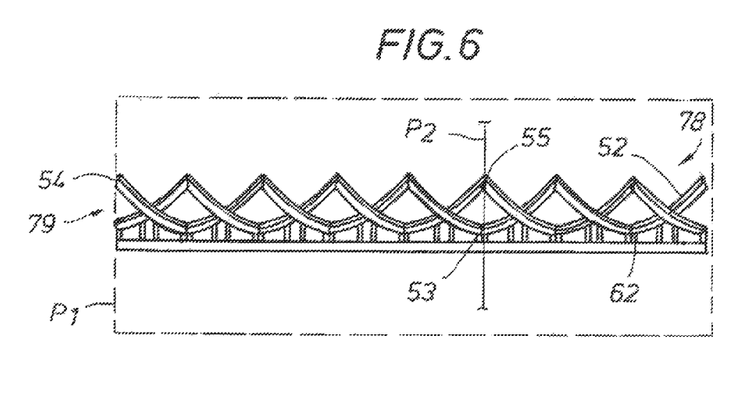
FIG. 6 is a side view of the solar collectors of FIG. 5.

Referring now to FIG. 6, an example of the rows 78, 79 is shown in a side view illustrating the relative lengthwise positioning between the lower edge 53 of each collector and the upper edge 55 of the adjacent forward collector 52, 54 of the same row 78, 79. In the embodiment of FIG. 6, a vertically oriented plane $P_2$ is positioned adjacent the respective terminal points of the upper and lower edges 55, 53 and aligned normal to plane $P_1$ (shown in a dashed outline). Strategically positioning each collector 52, 54 so that the lower and upper edges 53, 55 terminate at plane $P_2$ prevents the upper edge 55 of a forward collector 52, 54 from shading the lower edge 53 a rearward collector 52, 54 from vertically directed sunlight.

Figure 8:
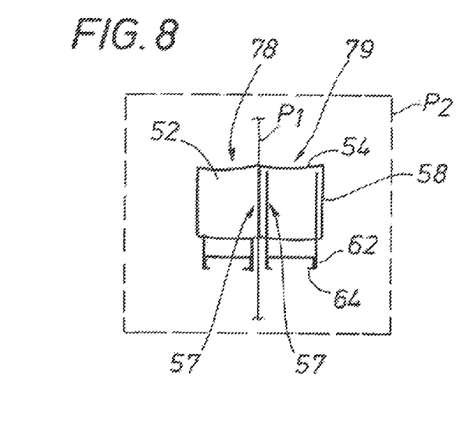
FIG. 8 is an end elevation view of the solar collectors of FIG. 5.

As noted above, an embodiment exists wherein the lower and upper edges 53, 55 of the collectors 52, 54 are substantially parallel. Referring again to FIG. 7, the lower and upper edges 53, 55 are depicted substantially coinciding with the plane $P_2$. Configuring and positioning the collectors 52, 54 so their sequentially spaced lower and upper edges 53, 55 terminate along plane $P_2$ can further maximize the solar energy collected by the collectors 52, 54. Moreover, setting plane $P_2$ (and edges 53, 55) orthogonal to the lateral edges 57 as shown, prevents sunlight from skirting the collectors 52, 54 while no portion of a collector 52, 54 is shaded by another collector 52, 54. An end view of the rows 78, 79 is provided in a side elevational view in FIG. 8. In this example, the lateral edges 57 of collectors 52, 54 from adjacent rows 78, 79 are aligned with plane $P_1$ along their entire length.

Figures 9, 13, 14:
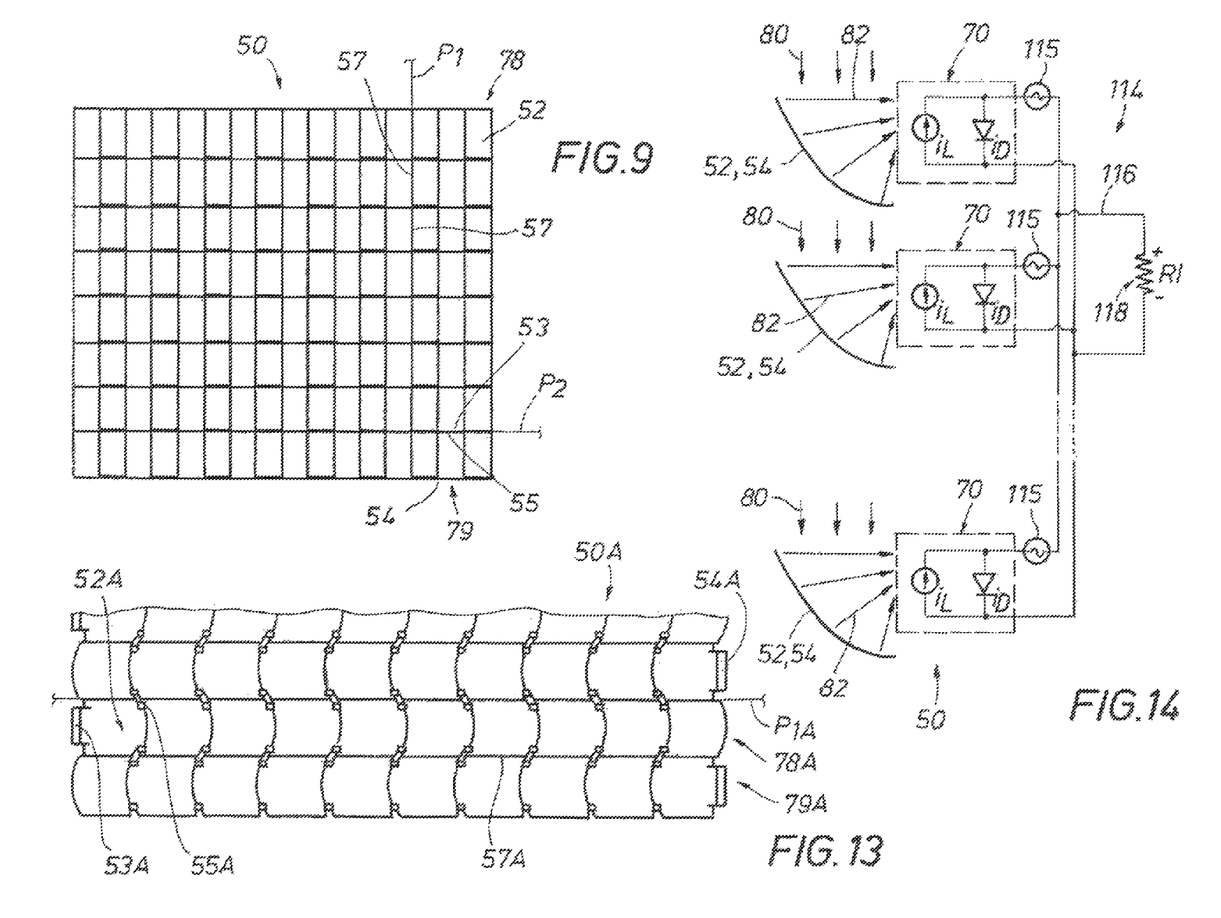
FIG. 9 is a side perspective plan view of an example of a solar array in accordance with the present disclosure.
FIG. 13 is a schematic example of a solar array connected with a load in accordance with the present disclosure.
FIG. 14 is an overhead plan view of a portion of an alternative embodiment of a solar array.

FIG. 9 provides an overhead view of the array 50 where the collectors 52, 54 are shown arranged in their respective rows 78, 79. Further the lateral edges 57 of the collectors 52, 54 are arranged along plane $P_1$ and the collectors 52, 54 are spaced apart within each row 78, 79 so that the lower and upper edges 53, 55 align with plane $P_2$. Accordingly, sunlight directed to the array 50 will not pass between adjacent collectors 52, 54, but instead will be collected by the collectors 52, 54 and reflected towards an associated solar module. Significant advantages are realized by the solar array 50 capturing substantially all directed sunlight; such as maximizing the collected solar energy per array area, thereby reducing the size of its frame 84. Additionally, reducing the spatial distance between collectors 52, 54, reduces the materials of construction.

Figure 10:
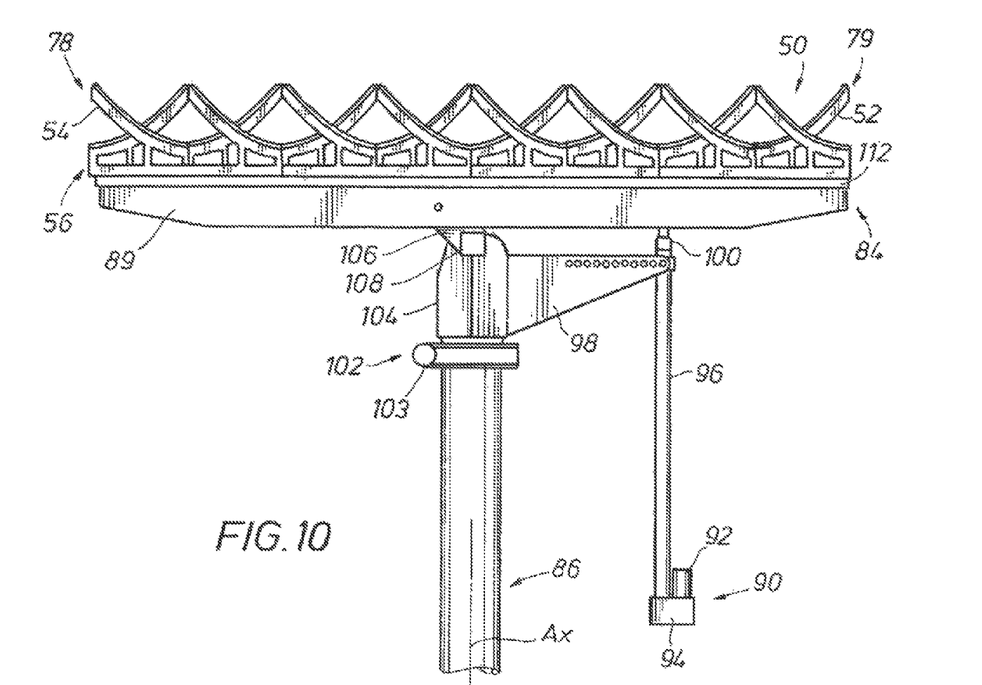
FIG. 10 is an overhead plan view of the solar array of FIG. 9.

Shown in side elevational view in FIG. 10, the array 50 includes a series of sequentially arranged rows 78, 79 of collectors 52, 54 shows mounted on a frame 84. An upper end of a cylindrical monopole 86 couples to the frame 84 proximate its mid section. The lower end of the monopole 86 is shown anchored at grade. The frame 84 includes parallel arranged girders 88 coupled to one another with cross members 89 shown projecting through bores formed laterally through the girders 88. The cross members 89 are illustrated as cylindrical members, but can have other cross sectional shapes as well. Cross beams 112 are attached on the upper surface of the girders 88 and arranged substantially parallel to the cross members 89. The cross beams 112 add torsional strength to the frame 84 and provide a surface on which the frame 56 for the collectors 52, 54 can be mounted. Shown depending downward from below the frame 84, is a pivot mechanism 90 for changing the pitch or attitude of the array 50 to compensate for the sun's movement so the array 50 continuously faces direct sunlight.

Figure 11:
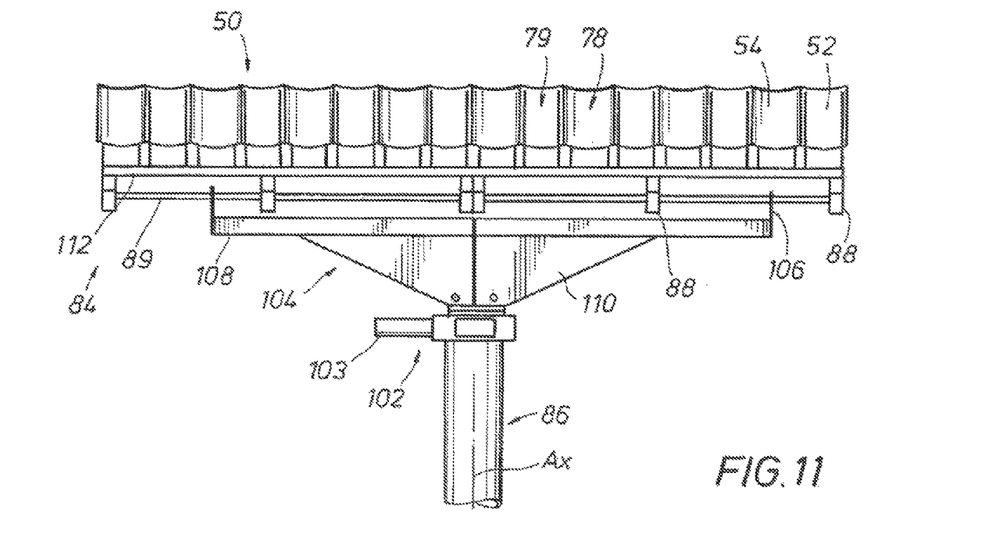
FIG. 11 is an end elevation view of the solar array of FIG. 9.

FIG. 11 illustrates in side elevation view an embodiment of the array 50 and monopole 86 where the frame 84 and array 50 are substantially perpendicular to the monopole 86. A mounting base 104 is shown coupled between the frame 84 and monopole 86. The mounting base 104 is coaxial with the monopole 86 and selectively rotatable about its axis $A_X$. A slew drive assembly 102 is shown affixed on the monopole 86 upper end that includes a motor 103 and a worm gear (not shown) driven by the motor 103. Teeth on the worm gear mesh with the teeth of a gear (not shown) coaxially coupled to the mounting base 104. Activating the motor 103 of the slew drive assembly 102 thus drives the gears to rotate the mounting base 104 and attached frame 84 and array 50. Rotating, in addition to pivoting the array 50, provides an added degree of freedom that enables orienting the array in direct sunlight throughout the day.

Figure 12:
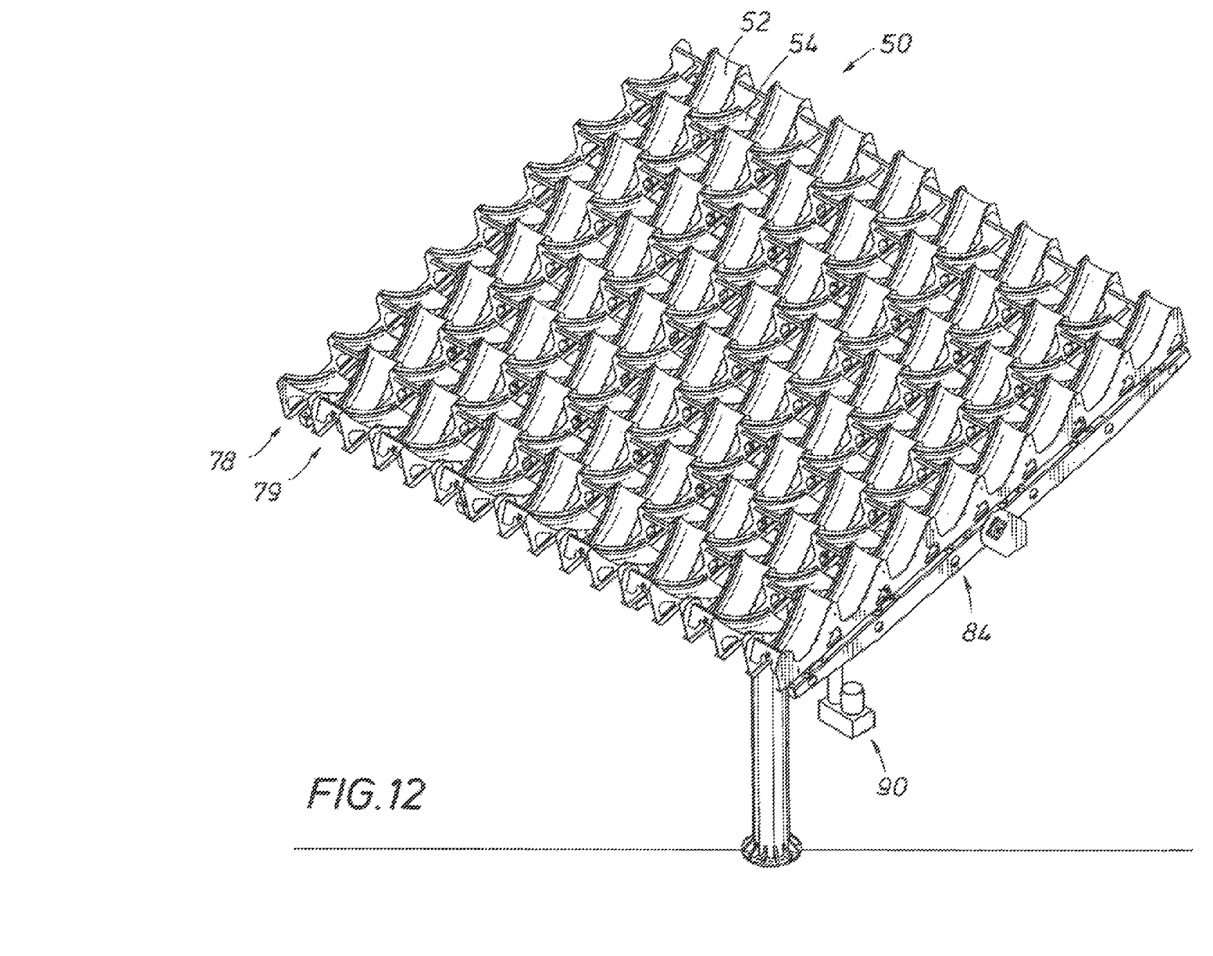
FIG. 12 is a side elevation view of the solar array of FIG. 9.

FIG. 11 illustrates an end elevation view of the array 50 mounted on the monopole 86. The ends of the girders 88 within the frame 84 are shown with a cross member 89 laterally inserted through bores (not shown) formed in each of the girders 88. The cross member 89 also projects through the upper portions of frame hinge members 106. The hinge members 106 are planar members, shown depending downward from the cross member 89 and connected on their lower portion to an elongated cylindrical hinge rod 108. The hinge rod 108 extends along a line substantially perpendicular to the rows 78, 79 and is attached on the upper end of a wing brace 110. The wing brace 110 projects laterally from opposing sides of the mounting base 104 having an upper surface that is substantially perpendicular to the axis $A_X$ of the monopole 86. The wing brace 110 attaches along the outer surface of the mounting base 104 aligned with the axis $A_X$ and its lower surface extends from the mounting base 104 at an angle oblique to the axis $A_X$ to the brace 110 terminal edge. In an embodiment, the cross beam 89 is rotatable within the hinge members 106 thus allowing the array 50 to pivot about a line coaxially with the cross beam 89. The pivot mechanism 90 is supported by the brace 98 at a location proximate its terminal end away from the mounting base 104. The pivot mechanism 92 includes a cylindrical member 96 that depends downward from the brace 98 with an enclosed gearbox 94 attached on the cylindrical member 96 lower end. A cylindrical motor 92 is also provided shown attached onto the gearbox 94. A push rod 100 is coaxially inserted within the cylindrical member 96 and shown with its upper end projecting upward from within the tubular 96 and through a bore (not shown) in the brace 98. The upper end of the push rod 100 contacts the bottom surface of a girder 88 at a location away from the midpoint of the array 50. As shown in a perspective view in FIG. 12, raising or lowering the push rod 100 pivots the frame 84 about the cross beam 89 for controlling the pitch of the array 50. A helical member (not shown) may be included within the cylindrical member 96 for converting rotational movement in the motor 92 and gearbox 94 into linear motion of the push rod 100.

An advantage of the open air design include not only accessibility to components in the array 50, but also the ability for natural and/or forced convection cooling. Another advantage is the open air design has a reduced profile that decreases wind loads on the system. Moreover, as illustrated in the side view of FIG. 10, arranging the collectors 52, 54 so their reflective sides are oppositely directed in successive rows creates a more symmetric array when viewed from the side. The resultant force from wind directed across a symmetrically arranged array 50 will be located at or substantially adjacent the axis $A_X$. Accordingly, a symmetric array 50 will be less likely to experience an unequal load distribution that could adversely affect rotating the array 50 or the rate of rotating the array 50. Another advantage of the open air design is that the solar energy reflects from the collectors 52, 54 and directly contacts the cell 70 without encountering another object. Unlike some of the other known solar systems, the open air design does not include a cover or lens, which irrespective of their transparency, do reflect some amount of solar energy thereby reducing efficiency. Without a cover the weight and cost of the present system is reduced. The system described herein also does not include a secondary reflector, which can reduce efficiency by up to 10% from the design disclosed herein.

In one example, the monopole 86 is mounted directly into the ground, which reduces the expense of installation where a hole has to built and a concrete footing pouted. This also makes installations possible where soil conditions might make a conventional system expensive and/or problematic. The surface mount also makes the array 50 and associated hardware portable. It provides flexibility of installation location if shade conditions change due to tree growth, additional construction, or other factors. Moreover, the array 50 and system can be relocated if the user relocates thereby providing an assurance the accumulated operational savings can eventually meet and surpass the original capital cost. The array 50 and its associated hardware is adaptable to a low profile roof mounting system, so that it can be installed in residential markets in densely developed urban areas.

FIG. 14 illustrates an example of a circuit 114 that includes the array 50 coupled with a resistive load 118. Collectors 52, 54 are illustrated in the path of sun rays 80 that then reflect and direct reflected rays 82 onto a solar cell 70. The solar cell 70 is schematically illustrated in the circuit 114 as a current source $i_L$ in parallel with a diode $i_D$. The output of the solar cell 70 for each collector 52, 54 is distributed to a line 116 connected to the load 118. An optional inverter 115 is shown in the circuit 114 for converting the electricity from direct current to alternating current. The inverter 115 can be included with each cell 70, groups of cells 70, or a single inverter 115 for the entire array 50. In another alternative, the inverter 115 regulates the current flow into the circuit 114, and when installed in association with each cell 70 or groups of cells 70, the inverter 115 can manage power to the circuit 114 thereby increasing overall electricity output. Providing multiple inverters 115, i.e. decentralized inversion, also reduces the cost of wiring harnesses and reduces direct current transmission distances and hence line loss, further increasing overall system efficiency. Decentralized inverter arrangement can allow for detailed monitoring of system performance as well as system power balancing; which can increase system output by 5-25% over conventional centralized inverting. Example inverters include a 3.0 kW grid-tied unit, a 3.0 kW battery tied unit and a 200 W grid-tied microinverter unit.

The load 118 can be any device that consumes electricity as well as any device for storing electricity. In one example of use, electricity generated by the array 50 and flowing to the line 116 is delivered to a residence; in this embodiment the load 118 includes electricity consuming devices within a household, such as lights, for refrigeration and/or heating, appliances, audio visual consumer electronics, processors, machines, communication devices, and the like. In another embodiment, more than one array 50 can connect to a circuit for powering multiple residences or an industrial facility. The slew drive 102 and pivot mechanism 90 can optionally be driven powered from electricity generated by the array 50, and thus can be considered as a part of the load 118. In yet another optional embodiment, at least a portion of the load 118 can be an entity that distributes electricity to electrical consumers. An example entity is a utility company, which may be referred to herein as the "grid".

Shown in overhead view in FIG. 13 is an example of an alternative embodiment of an array 50A having rows 78A, 79A of oppositely facing collectors 52A, 54A. In this example, the lateral edges 57A of the collectors 52A, 54A are generally parallel to one another. Similar to the array 50 of FIG. 10, the lateral edges 57A of adjacent rows 78A, 79A are in line with a plane $P_{LA}$. However, the upper edges 55A of the collectors 52A, 54A are curved whereas the lower edges 53A are linear. The collectors 52A, 54A of each row 78A, 79A are spaced so that no part of a reflective surface on a collector 52A, 54A is shaded by another collector 52A, 54A.

A solar tracking system (not shown) may be used for controlling the slew drive 102 and pivot mechanism 90 to position the array 50. The solar tracking system can be above ground and employ an astronomical algorithm that defines solar positioning for all latitudes and longitudes throughout daylight hours. The tracking system can include a periodic feedback mechanism to confirm that the that the collectors 52, 54 are focused on the sun and thus give maximum power yield.

EXAMPLE

In a non limiting example, the array 50 is made up of sixteen 180 watt modules, or rows 78, 79, are installed on a monopole 86 that is set into the ground. Each row 78, 79 is formed from eight collectors 52, 54 and eight cells 70. This forms an array 50 that is 16 wide by 8 high array (approximately 10' by 10' in total size) with 2.88 KW in power output; which is comparable in size to most conventional photovoltaic systems with power output at least double that of the unconcentrated systems.

The present invention described herein, therefore, is well adapted to carry out the objects and attain the ends and advantages mentioned, as well as others inherent therein. While a presently preferred embodiment of the invention has been given for purposes of disclosure, numerous changes exist in the details of procedures for accomplishing the desired results. For example, array embodiments are not limited to the number of collectors/cells described above, but can include any number of collectors and/or cells depending the on application. Additionally, the array can have different shapes, such as polygons, a curved periphery, rectangular, and non-standard shapes. Moreover, the size and shape of the collector can vary as well. These and other similar modifications will readily suggest themselves to those skilled in the art, and are intended to be encompassed within the spirit of the present invention disclosed herein and the scope of the appended claims. While the invention has been shown in only one of its forms, it should be apparent to those skilled in the art that it is not so limited but is susceptible to various changes without departing from the scope of the invention.

The invention claimed is:

1. A method of converting solar energy to electricity comprising:
   providing a plurality of solar cells and a plurality of solar collectors, each solar collector having a front side with a reflective surface, a lower edge, an upper edge, a left lateral edge, and a right lateral edge;
   arranging the collectors into rows;
   orienting the collectors so that the reflective surfaces of the collectors in each row face in the same direction;
   organizing the rows so the lateral edges of adjacent rows extend along a plane that is substantially parallel to the rows, so that substantially all of the solar energy directed along the plane contacts the collectors;
   orienting the collectors in the rows and the solar cells, so that solar energy that contacts one of the reflective surfaces is directed to one of the solar cells and converted to electricity by the solar cell; and
   directing the electricity converted by the solar cell to a load.

2. The method of claim 1, further comprising supporting the collectors in a recumbent position.

3. The method of claim 1, further comprising spacing the collectors within each row so that no portion of a collector is within a shadow from another collector in the same row.

4. The method of claim 1, further comprising forming an array of using the collectors, tilting and rotating the collectors to maintain maximum collection of solar energy.

5. The method of claim 1, further comprising orienting the collectors so that solar energy directed from reflective surfaces in a one of the rows is in a direction opposite from solar energy directed from reflective surfaces in rows that are adjacent to the a one of the rows.

* * * * *